(12) United States Patent
Yang et al.

(10) Patent No.: US 7,009,268 B2
(45) Date of Patent: Mar. 7, 2006

(54) WHEATSTONE BRIDGE SCHEME FOR SENSOR

(75) Inventors: Xiaofeng Yang, Corvallis, OR (US); Kevin Peters, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 6 days.

(21) Appl. No.: 10/828,334

(22) Filed: Apr. 21, 2004

(65) Prior Publication Data

US 2005/0239230 A1 Oct. 27, 2005

(51) Int. Cl.
*H01L 31/058* (2006.01)
*H01L 21/00* (2006.01)

(52) U.S. Cl. .......................... 257/467; 438/54
(58) Field of Classification Search ................. 438/54; 324/725; 257/414, 418, 426, 467, 470, 925, 257/E23.17
See application file for complete search history.

(56) References Cited

U.S. PATENT DOCUMENTS

| 5,595,942 A | 1/1997 | Albrecht et al. |
| 5,948,965 A | 9/1999 | Upchurch et al. |
| 6,211,540 B1 | 4/2001 | Takahashi et al. |
| 6,578,426 B1 | 6/2003 | Imai et al. |
| 6,615,668 B1 | 9/2003 | Toyoda et al. |
| 2004/0023064 A1 | 2/2004 | Ehresmann et al. |

FOREIGN PATENT DOCUMENTS

| EP | 0553452 | 8/1993 |
| WO | WO 2004/003535 A | 1/2004 |

OTHER PUBLICATIONS

Carl V. Thompson et al. "Submicron and Nano Materials: Science and Engineering," Department of Materials Science and Engineering, 13 Sheets.

M. Hliwa et al., "Intramolecular Wheatstone Bridge," Intramolecular Wheatstone, Sep. 22, 2003, 2 pages, http://www.cernes.fr/Oper_recherche/nanosciences/9-%20Molecul . . . .

D. Hoadley et al., "Mechanical Strain, Conductance Fluctuations, and Dynamics of Single Tunneling Defects," W. M. Keck Microfabrication Facility, Aug. 5, 2003, 1 page, http://kmf.pa.msu.edu/Research/resrch04.asp.

Y. Lee et al., "High-Cycle Fatigue Test of Nanoscale Si and $SiO_2$ Wires Based on AFM Technique,"Department of Mechanical Engineering, Faculty of Science and Engineering, Ritsumeikan University, 2 pages.

(Continued)

*Primary Examiner*—W. David Coleman
*Assistant Examiner*—Quovaunda Jefferson

(57) ABSTRACT

A Wheatstone bridge circuit for a sensor has: first and second sensor elements which respond to a stimulus generated when the sensor is exposed to a sample to be measured, the first and second sensor elements comprising first and second elongated n type nano width regions formed in a suitable substrate; third and fourth sensor elements which respond to the stimulus generated when the sensor is exposed to the sample to be measured, comprising third and fourth elongated p type nano width regions formed in the substrate; and interconnections which interconnect the first and second sensor elements with the third and fourth sensor elements so that the first and second sensor elements are separated from and connected to the third and fourth sensor elements in a manner to form a Wheatstone bridge configuration.

43 Claims, 6 Drawing Sheets

OTHER PUBLICATIONS

M. Lutwyche et al., "5×5 2D AFM Cantilever Arrays A First Step Towards A Terabit Storage Device," Sensors and Acutators, 1999, pp. 89-94, vol. 73.

T. Ondarcuhu et al., "Nanotube Devices," Aug. 5, 2003, 5 pages, http://www.cernes.fr/Oper_recherche/nanosciences/6%20-%20Mole.

"Nano Probe", Precision Engineering, Sep. 22, 2003, 2 pages, http://pe.wtb.tue.nl/Personal/bos/probe.htm.

Yi Cui et al. Nanowire nanosensors for highly sensitive and selective detection of biological and chemical species. Science. Aug. 2001. pp. 1289-1292. v293 n5533.

European Search Report. EP 05252231. Patent application filed Apr. 8, 2005. Report issued Aug. 18, 2005 at Munich.

WHEATSTONE BRIDGE SCHEME FOR SENSOR

Prior attempts to form a Wheatstone Bridge for use in nano scale biological or chemical sensors have resulted in arrangements which have suffered from shortcomings such as there being no offset cancellation at the input stage, the dynamic range of the circuit being reduced, a lower power supply noise rejection ratio (PSRR) resulting, and/or it being detrimentally affected by temperature.

BRIEF DESCRIPTION OF THE DRAWINGS

FIG. 9 is a schematic layout showing a centroid arrangement via which linear fabrication process variations can be compensated for.

FIG. 11 is a schematic layer showing a further centroid layout arrangement via which fabrication process variations can be compensated for.

DETAILED DESCRIPTION OF THE EXEMPLARY EMBODIMENTS

The embodiments of the invention relate to but not limited to nano scale semiconductor type field-effect sensors including biological and chemical sensors. In these type of semiconductor sensors which are fabricated to include nano-scale wires, a suitable coating or arrangement is provided over the wires which reacts or responds to a given biological or chemical agent that is allowed to come in contact with the coating/arrangement. This coating/arrangement responds by generating a sensible stimulus in the form of the attachment of species on the sensor surface which change the nanowire surface potential and hence the conductance of the nano wires. By sensing the change in the conductance of the nano wires it is possible to sense whether or not certain biological or chemical agents are present.

Inasmuch as these nano wire sensor elements are, in accordance with the embodiments of the invention, elements of a Wheatstone bridge circuit, they are, in addition to being configurable as chemical and biological sensors, also adaptable to respond to other stimuli such as photons and magnetic fields. The scope of application of the embodiments is not limited to the above mentioned applications and the various other possibilities will become evident as the disclosure of the embodiments unfolds.

A full Wheatstone bridge circuit includes four resistive components (R1, R2, R3 and R4). These resistive components are connected so as to establish junctions A, B, C and D. Further, as show in FIG. 1, these resistive components are connected with a voltage source Vin across junctions A and C and voltmeter Vg which measures the voltage which is developed across junctions B and D.

The up/down sense of the arrows in this figure indicate the direction of response to external stimulus. The circuit effectively adds the differential outputs of R1–R4 and R2–R3. By using all of the resistances R1, R2, R3 and R4 as sensing elements and arranging R1 and R3 to react to the same stimulus in the opposite way to R2 and R4, it is possible with the embodiments of the invention, to provide a gain of 4 without adding amplification noise.

Figure 2:
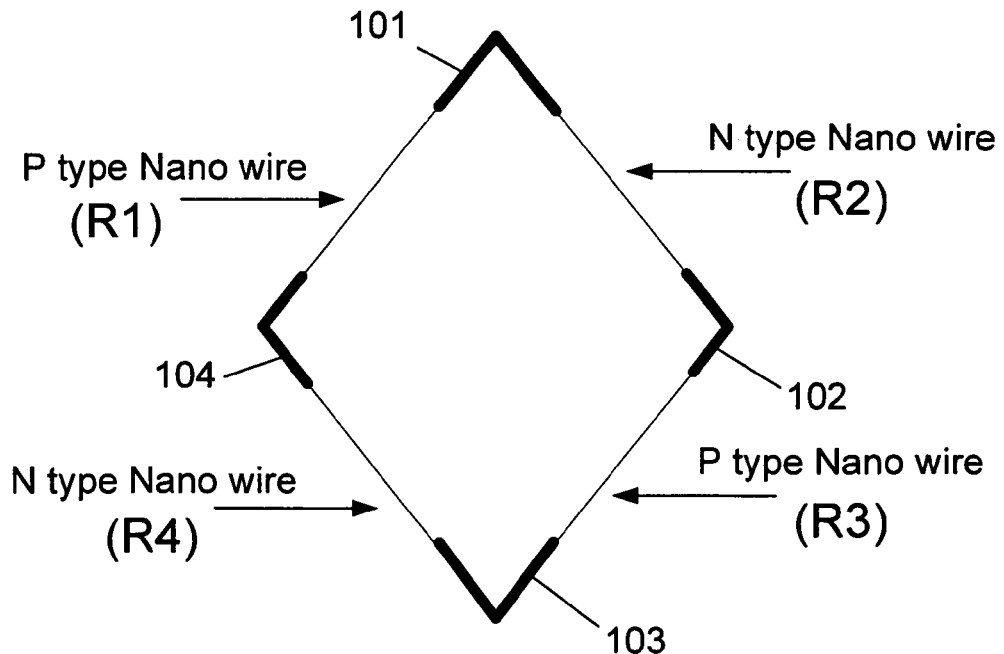
FIG. 2 is a schematic depiction of a nano wire Wheatstone Bridge implementation of a Wheatstone Bridge.

The embodiments of the invention implement a full Wheatstone Bridge by using P type and N type semiconductor nano wires as the resistances R1, R2, R3 and R4 in the manner depicted in FIG. 2. The semiconductor materials used to form the nano wires can be of any suitable semiconductor material such as silicon, germanium, diamond, SiC, Si—Ge alloy, GaAs, other III-V compounds, GaN, other II-VI compounds, SnO, or other metal oxide semiconducting materials.

Figure 1:
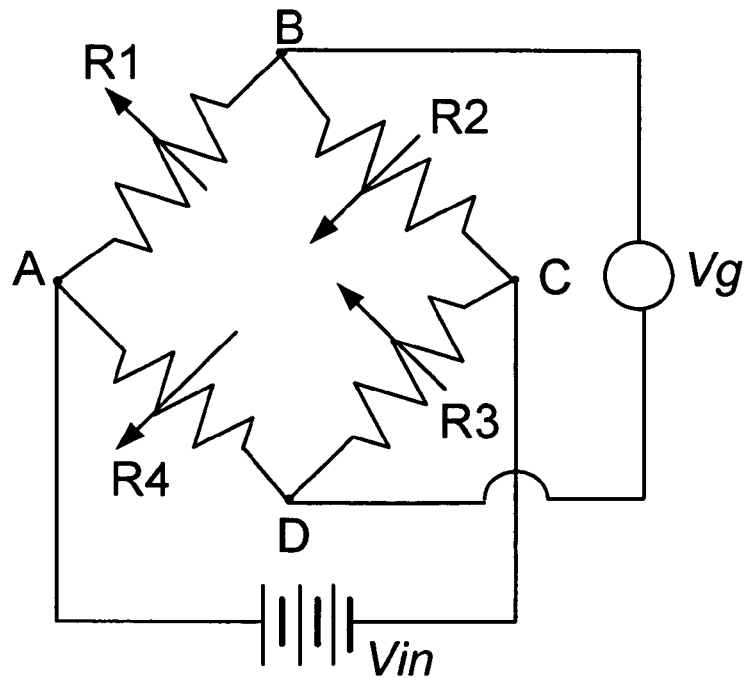
FIG. 1 is a schematic depiction of a Wheatstone Bridge.

In FIG. 2 numerals 101–104 denote low resistance connection elements, such as metallic layers/lines, which are arranged to provide low resistance connections between the nano wires and thus respectively function as the connections B, C, D and A shown in FIG. 1. In the embodiments of the invention, each of the nano wires comprise an elongated, nano width doped region formed on a suitable insulating layer, such as silicon oxide, which is formed on a suitable substrate, such as silicon.

In the embodiments of the invention, the nano wires are all adapted to respond to a stimulus such as the application of a chemical or biological agent (merely by way of example) to a sensing coating and/or arrangement (not shown) which is suitably disposed with the wires. The interaction between the coating/arrangement and the agent induces the P type wires to increase resistance with a positive charge and N type wires to react by decreasing resistance with the same charge. This achieves the above mentioned gain of 4 without adding amplification noise.

With this type of arrangement it is desirable that the bridge assume a balanced state prior to being exposed to a sample. An ideally balanced bridge has all four resistances equal, i.e., R1=R2=R3=R4 so that it produces a zero reading when there is no stimulation. That is to say, for a resistive measurement, it is desirable to have a balanced bridge, whether it is a full bridge, half or even a quarter bridge.

Embodiments of the present invention are effective in a balanced full Wheatstone Bridge configuration, as described above, wherein the four resistor elements are chemically sensitive and are deployed as two pairs of substantially identical resistors, R1 & R3 and R2 & R4, and wherein the pairs are doped differently so as to respond oppositely to the same stimulus (as in FIG. 1). Embodiments of the invention can also be configured as a balanced half Wheatstone bridge in which only one pair of substantially identical resistors (R1 & R3) respond to the stimulus in the same direction and resistors R2 & R4 are not responsive to the stimulus. Embodiments of the invention can also be configured as a balanced quarter Wheatstone bridge in which only one resistor, R1, is responsive to the stimulus and resistors R2, R3, and R4 are not responsive.

In the above-mentioned embodiments the balanced full Wheatstone bridge is comprised of nanoscale resistor elements, R1–R4. However, embodiments of the invention can be implemented entirely or partly of microscale resistor elements which are sensitive to external stimulus. The balanced quarter and half Wheatstone bridge embodiments of the present invention can also be comprised of nanoscale resistor elements and microscale resistor elements having the desired balance and response to external stimulus, as described above.

Figure 3:
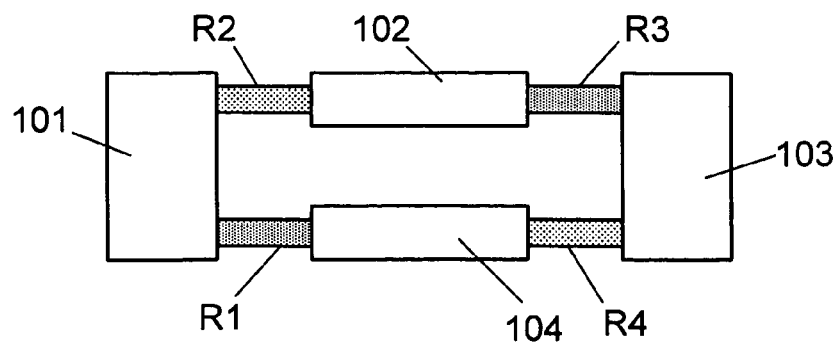
FIG. 3 is a plan view of a full Wheatstone Bridge constructed using nano wires.

FIG. 3 is a schematic plan view of a nano-wire Wheatstone Bridge. In this figure, resistances R1, R2, R3 and R4 are interconnected by the metallic connectors 101–104 in the same manner shown in FIG. 2.

Figure 4:
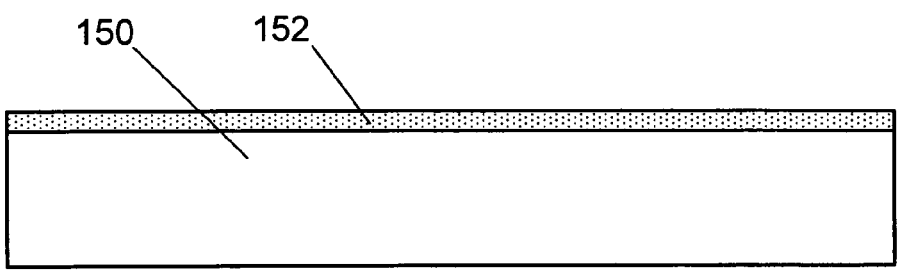
FIGS. 4–8 are views depicting the steps which are involved in the fabrication of a Wheatstone Bridge.
Figure 5:
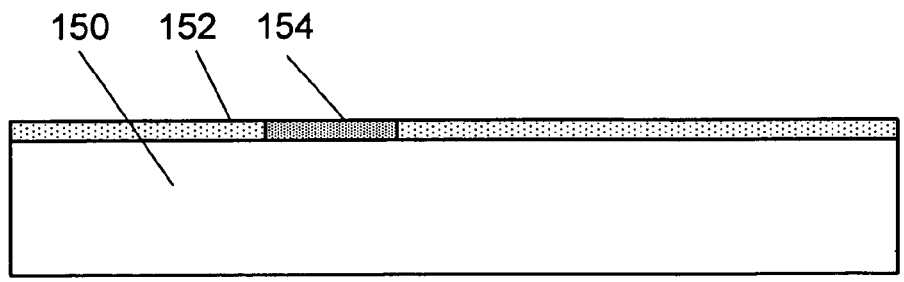
Figure 6:
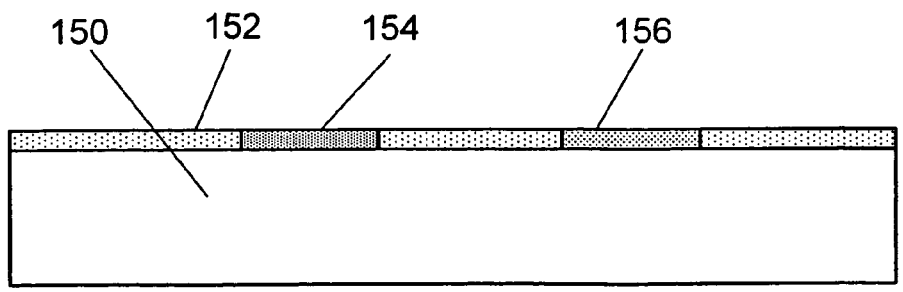
Figure 7:
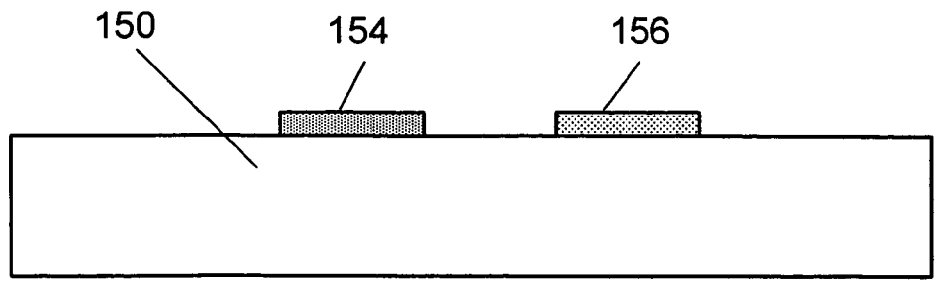

FIGS. 4–8 depict a process via which the arrangement show in FIG. 3 can be fabricated. FIG. 4 shows a wafer 150 on which a layer of silicon 152 suitable for doping has been prepared. FIG. 5 shows a first P type nano wire (viz., an elongated nano width region) 154 which is produced using a suitable masking and doping technique such as ion implantation or the like. FIG. 6 shows a second nano wire 156, which in this instance is a N type doped wire (viz., an elongated nano width region) formed in a predetermined spatial relationship with the first wire.

After the superfluous material has been removed such as by etching (FIG. 7) the remaining nano-wires 152, 154 are electrically connected by metallization and patterning (FIG. 8) schematically depicted at 158. In that these techniques are well known in the art of semiconductor fabrication inclusive of the doping concentrations, doping agents, etchants, photolithographic materials, and nano patterning, etc. which are used, and the various alternatives ways in which they can be used, no further disclosure will be given for the sake of brevity.

However, with nano-scale production a minor process variation may have a large impact of the characteristics of the nano scale wires. That is to say, during fabrication it is inevitable that there is some variation (e.g. process variation) in the width (or other parameter) of the wire. However, because the embodiments of the invention are fabricated on the nano scale as different from a micron scale (wherein variation tends to be at the lower end of the micron scale), the impact of any variation in the nano scale represents a large percentage deviation and therefore has a very large effect on the resistance value of the nano wires, even to the degree that the sensor sensitivity could be overwhelmed.

Figure 9:
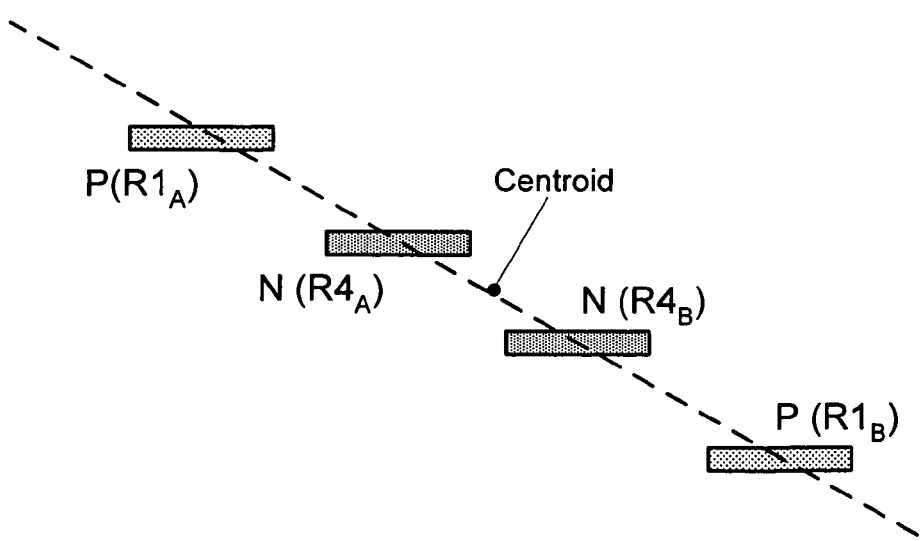

As noted above, in the case of a full Wheatstone bridge, the resistance of the two P type resistors need to be identical and the resistance of the two N type resistor need to be identical. FIG. 9 shows a nano-wire fabrication layout which attenuates the effect of a possible linear variation due to fabrication process variation by enabling resistance matching. This layout improves the bridge balance by using a common centroid about which the nano wires are disposed and thus arranges the wires so that the linear variation in the fabrication process is shared in a manner which induces a mutual balancing effect.

FIG. 9 shows a situation wherein two nano wires in one arm of the bridge shown in FIG. 2, which comprise substantially equivalent resistances R1 and R4 for example, are each formed in two halves, viz., $R1_A$ and $R1_B$, and $R4_A$ and $R4_B$. $R1_A$ and $R1_B$ are fabricated collinearly to $R4_A$ and $R4_B$ and such that their centroids are identical. Because the resistor halves are collinear with a common centroid, any differences in two halves $R1_A$ and $R1_B$ due to a linear process variation will be very similar to that on the halves $R4_A$ and $R4_B$ so that the resistances of R1 and R4 will therefore exhibit essentially similar characteristics and the possible detrimental effects of linear process variation will be compensated.

Figure 10:
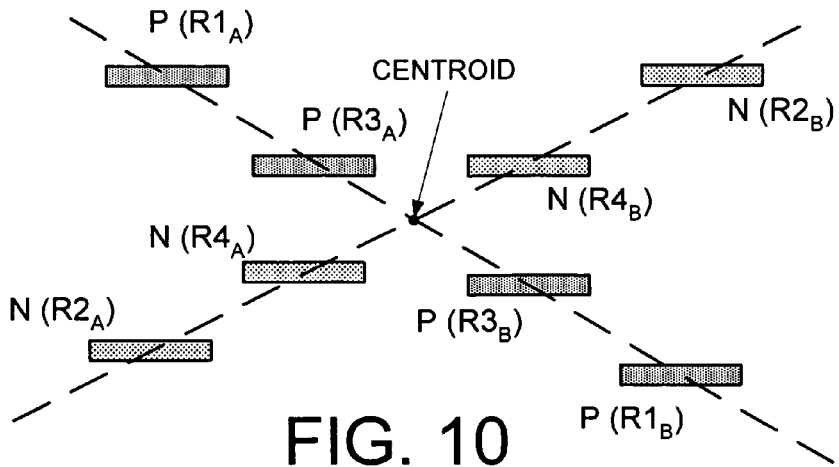
FIG. 10 is a schematic layout similar to that shown in FIG. 9 showing a variant of the centroid arrangement depicted therein.

FIG. 10 shows the situation wherein each of the resistances R1–R4 is formed as two halves wherein each is designated with the suffix A or B. By forming the two halves and four resistances in a corresponding spatial relationship with the common centroid the effect of one or more linear variations during fabrication can be compensated and the resistances of each resistor formed by nano wires can be equalized.

Figure 11:
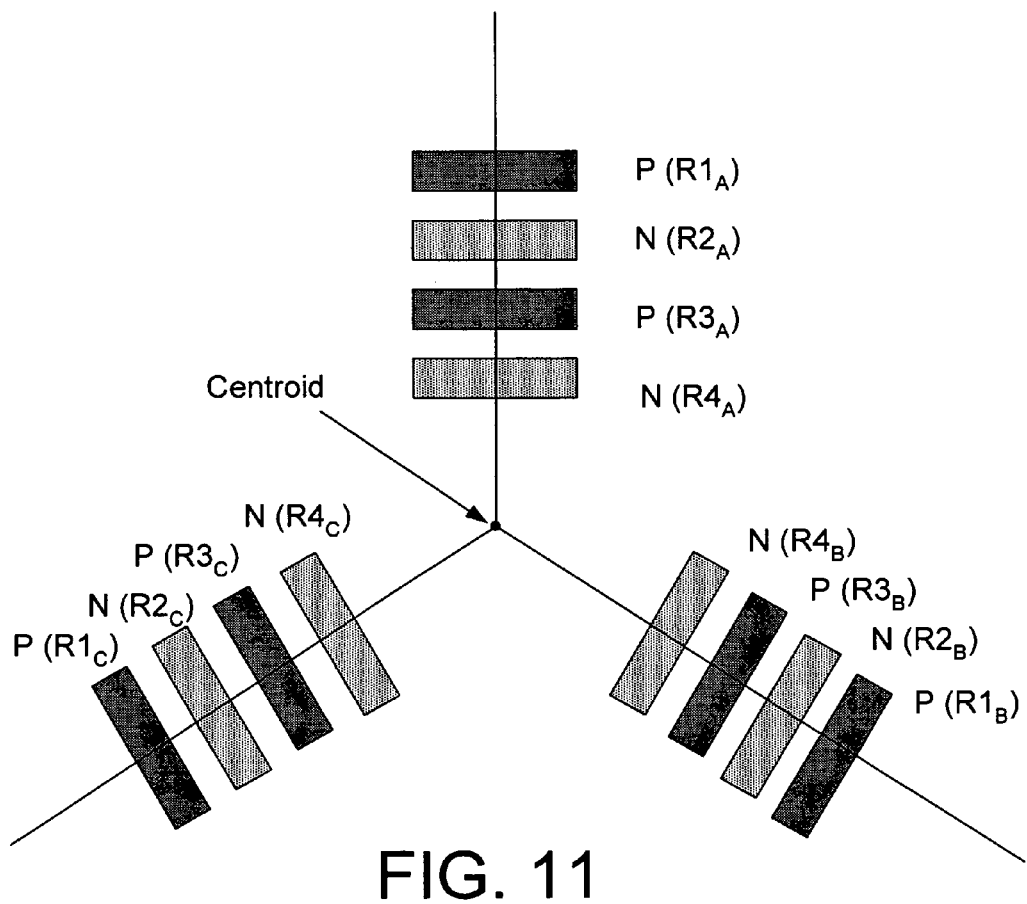

Common centroid layout techniques can be realized with more than two identical sub units. FIG. 11 shows the situation wherein each of the resistances R1–R4 is consisted of three sub units wherein each is designated with the suffix A, B or C. What is not shown is the low resistance path to connect these three sub units together to form one resistor. By forming the three sub units essentially equidistant from and about a centroid and four resistances in a corresponding spatial relationship with the common centroid the effect of one or more linear variations during fabrication can be compensated and the resistances of each of resistors can be equalized.

The common centroid layout technique is particularly effective in compensating for linear process variations. There are instances wherein non-linear process variations cannot be adequately compensated, for example, when the variations are due to differences in the N-doped and P-doped regions. In these situations it is possible to gate the wires, in order to adjust their resistance and to balance the circuit. Gating the semiconducting wires may be done via an applied electric field.

Figure 8:
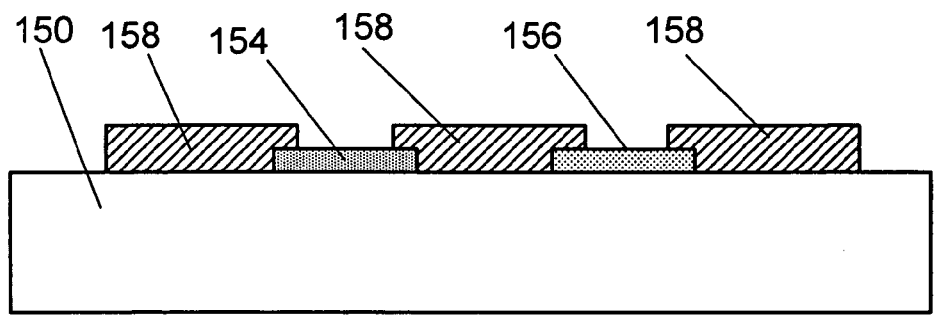
Figure 12:
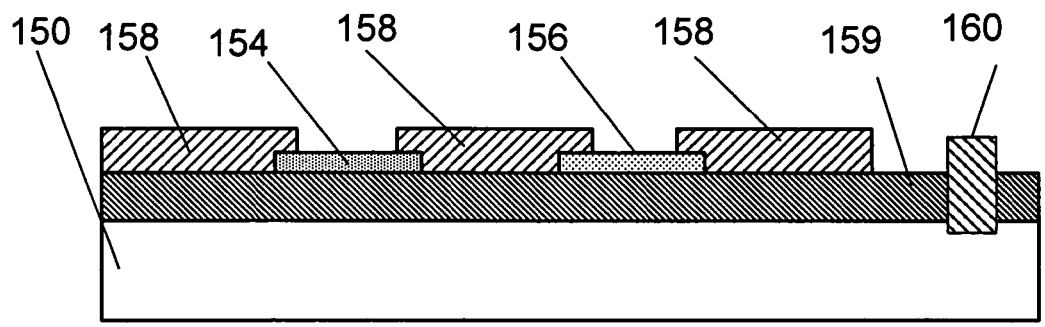
FIG. 12 is a sectional view showing an embodiment of the invention wherein an appropriate bias is applied to the substrate to negate average imbalance between the sensor elements.

FIG. 12 is a side-view depiction of an appropriate embodiment as an extension of FIGS. 3 and 8. In FIG. 12, the substrate 150 is structured so as to present an electric field to the wires 154 and 156, for instance by the substrate comprising a thin insulating layer 159 and a conducting underlayer that can be contacted electrically by a conducting element 160. A convenient way to fabricate such a structure employs a silicon-on-insulator starting wafer though other methods can also be used. In FIG. 12, note that a positive gating field will tend to decrease resistance in N-doped wires and increase resistance in P-doped wires, whereas a negative gating field will do the opposite. This embodiment of gating the P and N-doped wires via the common substrate potential is therefore particularly well adapted to balancing P-type and N-type Wheatstone bridge circuits where doping variation may require compensation.

Figure 13:
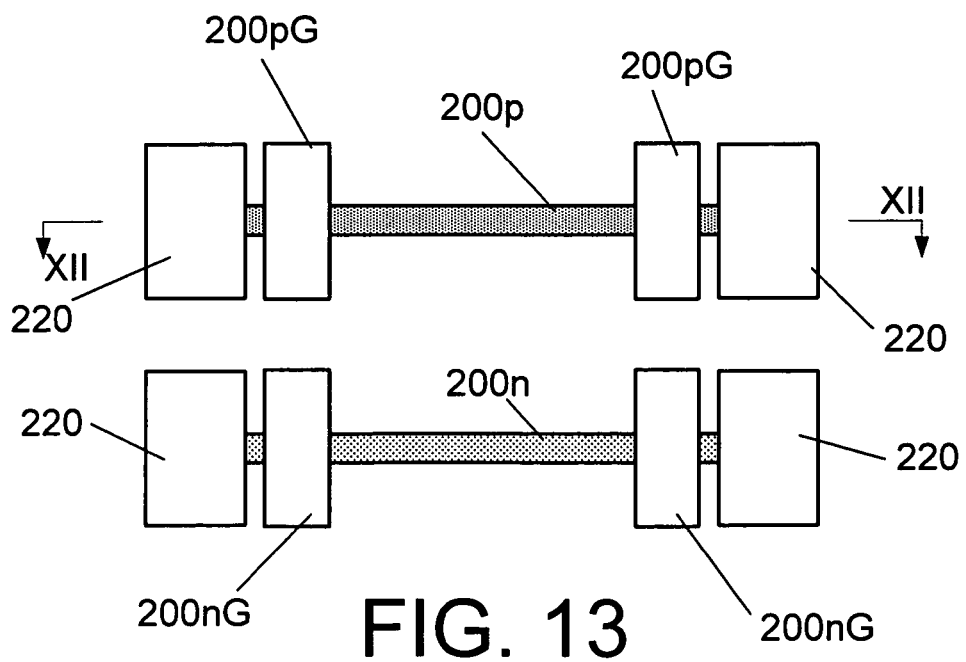
FIG. 13 is a top plan view showing an embodiment of the invention wherein the bridge is electrically trimmed by gating the nano wires to produce an arrangement via which balance can be actively achieved.

Individual wires can be gated to balance the Wheatstone bridge circuit, as shown in FIGS. 12 and 13. Here, a gate is provided on top of a section of a wire and is separated from it by a thin dielectric layer, such as 10-nm thick, thermally grown silicon dioxide. In accordance with this embodiment, the wires 200p, 200n are each provided with one or more gates. In the arrangement shown in FIGS. 12 and 13, the nano-wires 200p, 200n respectively have gates 200pG, 200nG associated therewith. Each of these gates 200pG, 200nG comprises an electrically conductive layer (such as metal) which is separated from the nano wire by an insulating oxide film 210.

The ends of the wires are shown electrically connected to connector elements 220 which are made of a highly conductive material such as aluminum or the like. Although only two wires are show it will be understood that more can be formed and that the connector elements, although here not illustrated as doing so, are suitably connected with other elements to form a bridge circuit.

Figure 14:
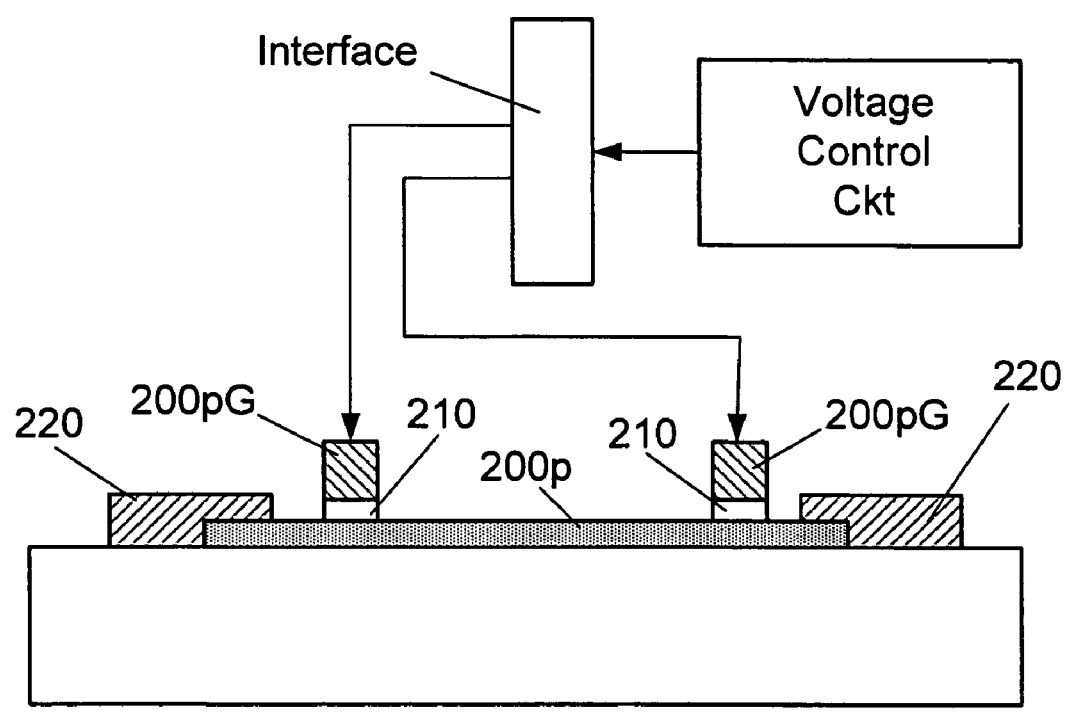
FIG. 14 is a side view of the arrangement shown in FIG. 13 as taken along section line XII—XII.

As shown in FIG. 14, the gates are electrically connected via suitable wiring to an interface. This interface is connected with a voltage control circuit which is responsive to the output of the bridge circuit and which is capable of selectively applying a suitable voltage to one or more of the gates to bring the bridge into balance. This process would typically be carried out during sensor initialization/calibration wherein the output is adjusted prior to the sensor being exposed to a sample requiring measurement.

As noted above, a common centroid layout configuration of the Wheatstone sensors is effective in compensating for linear process variations. It is further noted that a common centroid layout may also be used to improve the performance of the Wheatstone bridge in some specific applications or environments where non-process variations may occur.

For example, a Wheatstone bridge according to one embodiment of the invention may have a common centroid layout configuration and may be used for biological and/or chemical sensing within micro/Nano-fluidic systems. That is to say, the common centroid layout may compensate for certain variations with the fluidic system, such as in the case of sensor elements that are positioned near the boundary of a flow region. This may be useful in lab-on-a-chip and other applications of integrated fluidics. In another embodiment, the balanced Wheatstone bridge is used to adapt to linear variations in a flowing stream along the flow direction.

Although the invention has been disclosed with reference to only a limited number of embodiments, it will be appreciated that the scope of the invention, which is limited only by the appended claims, is not restricted to these specific examples and that various modifications and changes, which will be self-evident to the person skill in the art to which the present invention is applicable given the preceding disclosure, can be implemented without undue experimentation.

What is claimed is:

1. A method of making a Wheatstone bridge circuit for a sensor, comprising:
   forming first and second sensor elements by forming first and second elongated n type nano width regions on a suitable substrate;
   forming third and fourth sensor elements by forming third and fourth elongated p type nano width regions on the substrate; and
   interconnecting the first and second sensor elements with the third and fourth sensor elements with conductive connector elements so that the first and second sensor elements are separated from and connected to the third and fourth sensor elements in a manner to form a Wheatstone bridge configuration.

2. A method as set forth in claim 1, wherein the Wheatstone bridge circuit is balanced and wherein the four sensor elements have substantially the same resistance.

3. A method as set forth in claim 1, wherein the sensor elements are substantially equivalent in at least one of length, width, thickness, carrier mobility, carrier concentration, and dielectric thickness.

4. A method as set forth in claim 1, further comprising:
   forming the first and second sensor elements so as to have a first predetermined spatial relationship with a centroid; and
   forming the third and fourth sensor elements so as to have a second predetermined spatial relationship with the centroid.

5. A method as set forth in claim 4, further comprising forming all the sensor elements to be substantially collinear wherein they are spaced along a line which passes through the centroid.

6. A method as set forth in claim 1, further comprising:
   forming a plurality of n type nano width regions in the substrate so that each region is essentially equidistant from and about a centroid and selectively connecting n type nano width regions so as to form the first sensor elements;
   forming a second plurality of n type nano width regions in the substrate so that each region is essentially equidistant from and about the centroid and selectively connecting n type nano width regions so as to form the second sensor elements;
   forming a plurality of p type nano width regions in the substrate so that each region is essentially equidistant from and about the centroid; and selectively connecting p type nano width regions so as to form the third sensor elements;
   forming a second plurality of p type nano width regions in the substrate so that each regions is essentially equidistant from and about the centroid and selectively connecting selected p type nano width regions so as to form the fourth sensor elements and to cause the third and fourth sensor elements to have essentially the same resistance characteristics as the first and second sensor elements.

7. A method as set forth in claim 1, further comprising:
   providing an electrical connection to the substrate, and
   providing an appropriate bias such as to substantially negate any average resistance imbalance between the N-type and P-type sensor elements.

8. A method as set forth in claim 1, further comprising:
   forming first gate over the first elongated nano width region respectively so as to be separated therefrom by an oxide layer; and
   selectively applying a voltage to the gate to negate an imbalance in the bridge circuit.

9. A method as set for in claim 8, further comprising:
   forming at least one of second, third, and fourth gates over the second, third and fourth elongated nano width regions respectively so as to be separated therefrom by an oxide layer; and
   selectively applying a voltage to at least one of the second, third and fourth gates to negate an imbalance in the bridge circuit.

10. A method as set forth in claim 1, further comprising:
    forming a plurality of gates over each of the first and second elongated n type nano width regions so as to be separated therefrom by an oxide layer;
    forming a plurality of gates over each of the third and fourth elongated p type nano width regions so as to be separated therefrom by an oxide layer, and
    selectively applying a voltage to at least one of the gates to negate an imbalance in the bridge circuit.

11. A method as set forth in claim 1, further comprising: configuring the first sensor element to be responsive to a particular external stimulus of chemical or non-chemical nature.

12. A method as set forth in claim 11, further comprising: configuring the third sensor elements to be responsive in the same way as the first resistor to the external stimulus.

13. A method as set forth in claim 12, further comprising configuring the second and fourth sensor elements to be responsive in a manner which is opposite to the manner in which the first sensor element is responsive to the external stimulus.

14. A Wheatstone bridge circuit for a sensor, comprising:
first and second sensor elements which respond to a stimulus generated when the sensor is exposed to a sample to be measured, the first and second sensor elements comprising first and second elongated n type nano width regions formed in a suitable substrate;
third and fourth sensor elements which respond to the stimulus generated when the sensor is exposed to the sample to be measured, comprising third and fourth elongated p type nano width regions formed in the substrate; and
interconnections which interconnect the first and second sensor elements with the third and fourth sensor elements so that the first and second sensor elements are separated from and connected to the third and fourth sensor elements in a manner to form a Wheatstone bridge configuration.

15. A Wheatstone bridge as set forth in claim 14, wherein the p type and n type nano width regions are formed of a semiconducting material selected from the group consisting of silicon, germanium, diamond, SiC, Si—Ge alloy, GaAs, other III-V compounds, GaN, other II-VI compounds, SnO, other metal oxide semiconducting materials, and wherein the p type and n type sensor elements are chemically doped so as to be p type and n type elements.

16. A Wheatstone bridge as set forth in claim 14, wherein the four sensor elements have substantially equal resistance characteristics and thus substantially balance the Wheatstone bridge.

17. A Wheatstone bridge circuit as set forth in claim 14, further comprising means for balancing the bridge circuit.

18. A Wheatstone bridge as set forth in claim 14, wherein the sensor elements comprise P-type and N-type sensor elements which are formed on a substrate which is configured to be biased to balance the P-type and N-type sensor elements.

19. A Wheatstone bridge as set forth in claim 14, wherein the substrate comprises a semiconducting top layer of submicron thickness that is separated by an insulating layer from an underlying conducting layer that is configured to be electrically biased.

20. A Wheatstone bridge circuit as set forth in claim 14, wherein the first and second sensor elements are essentially equidistant from a centroid, and wherein the third and fourth sensor elements are essentially equidistant from the centroid.

21. A Wheatstone bridge circuit as set forth in claim 14, wherein the sensor elements are arranged collinearly.

22. A Wheatstone bridge circuit as set forth in claim 14, wherein the sensor elements share a common centroid.

23. A Wheatstone bridge circuit for a sensor comprising:
a plurality of n type nano width regions which are arranged in a predetermined spatial relationship and wherein first and second groups of n type nano width regions, which share a common centroid, are respectively connected to form two n type sensor elements which have essentially the same resistance; and
a plurality of p type nano width regions which are arranged in a predetermined spatial relationship and wherein first and second groups of p type nano width regions, which share the same common centroid, are respectively connected to form two p type sensor elements which have essentially the same resistance as the two n type sensor elements.

24. A Wheatstone bridge circuit as set forth in claim 23, comprising: a first gate formed over one of the nano width regions and separated therefrom by an oxide layer, the gate being configured to have a voltage selectively applied thereto to negate an imbalance in the bridge circuit.

25. A Wheatstone bridge circuit as set forth in claim 24, further comprising:
at least one of second, third, and fourth gates formed over portions of other elongated nano width regions respectively so as to be separated therefrom by an insulating dielectric layer;
the first, second, third and fourth gates being respectively configured to have a voltage applied thereto in a manner which negates an imbalance in the bridge circuit.

26. A Wheatstone bridge circuit as set forth in claim 23, further comprising:
a plurality of gates each arranged over an elongated n type nano width regions; and
a plurality of gates each arranged over each of the elongated p type nano width regions, and wherein:
the gates are each being configured to have a voltage applied thereto in a manner which negates an imbalance in the bridge circuit.

27. A half Wheatstone bridge circuit comprising:
a first and second sensor elements that are elongated, balanced, and nanoscale in a direction of their cross-sections, and that respond electrically upon exposure to a stimulus;
a third and forth resistor element that do not respond to the stimulus and have substantially the same resistance as the first and second element; and
interconnections among the elements in a manner to form a half Wheatstone bridge circuit.

28. A half Wheatstone bridge circuit as set forth in claim 27, wherein the third element is configured similarly to the first element, and the fourth element is configured similarly to the second element.

29. A half Wheatstone bridge circuit as set forth in claim 27, wherein the sensor elements are configured to be semiconducting by controlled doping.

30. A half Wheatstone bridge circuit as set forth in claim 27, wherein the sensor elements are nanoscale in two substantially orthogonal cross-sections.

31. A Wheatstone bridge circuit as set forth in claim 29, wherein the first and second sensor elements are similarly doped so as to respond similarly upon exposure to the stimulus.

32. A half Wheatstone bridge circuit as set forth in claim 27, wherein the first and second sensor elements are P and N doped respectively so as to exhibit opposing responses to the stimulus.

33. A half Wheatstone bridge circuit as set forth in claim 27, wherein the first and second sensor elements are doped and fabricated suitably upon a common electrically biasable substrate so the substrate bias acts to balance their resistance.

34. A Wheatstone bridge circuit comprising:
first, second, third and fourth resistors of substantially equal resistance on a substrate; the substrate comprising:
an electrically conducting underlayer and an insulating layer that separates the resistors from the underlayer, the first and second resistors being configured to be semiconducting with P and N type doping respectively; and wherein the substrate is configured to be biased electrically so as to negate any imbalance in the first and second resistances.

35. A Wheatstone bridge circuit as set forth in claim 34, wherein the third and fourth resistors are configured to be semiconducting with P and N type doping respectively; and wherein the substrate is biased electrically so as to negate any imbalance in the third and fourth resistances.

36. A Wheatstone bridge circuit for a sensor, comprising:
first and second resistor elements at least one of which responds to an external stimulus by exhibiting a change in electrical properties, and at least one of which has a nano or micro width;
third and fourth resistor elements; and
interconnections which interconnect the first and second resistor elements with the third and fourth resistor elements so that the first and second resistor elements are separated from and connected to the third and fourth resistor elements in a manner to form a Wheatstone bridge configuration wherein the first and second resistor elements form a first pair of the bridge circuit elements and the third and fourth resistor elements form a second pair of the bridge circuit elements.

37. A Wheatstone bridge circuit as set forth in claim 36, wherein the first and second resistor elements comprise first and second elongated n type regions, and wherein the third and fourth resistor elements comprise elongate p type regions.

38. A Wheatstone bridge circuit as set forth in claim 36, wherein the other of the first and second resistor elements has a nano or micro width.

39. A Wheatstone bridge circuit as set forth in claim 36, wherein at least one of the third and fourth resistor elements has a nano or micro width.

40. A Wheatstone bridge circuit as set forth in claim 36, wherein both of the first and second resistor elements respond to external stimulus by exhibiting a change in electrical properties when exposed to the external stimulus.

41. A Wheatstone bridge circuit as set forth in claim 36, wherein at least one of the third and fourth resistor elements responds to an external stimulus by exhibiting a change in electrical properties.

42. A Wheatstone bridge circuit as set forth in claim 36, wherein both of the third and fourth resistor elements respond to an external stimulus by exhibiting a change in electrical properties.

43. A Wheatstone bridge circuit as set forth in claim 36, wherein at least one of the first, second, third and fourth resistor elements has a micro width and wherein at least one of the first, second, third and fourth resistor elements has a nano width.

* * * * *